US005174201A

United States Patent [19]

Andris et al.

[11] Patent Number: 5,174,201

[45] Date of Patent: Dec. 29, 1992

[54] THICK FILM MASK SEPARATION DETECTION SYSTEM

[75] Inventors: Gerald S. Andris, Poughkeepsie; John P. Gauci, Putnam Valley; John F. Harmuth, Pleasant Valley, all of N.Y.

[73] Assignee: International Business Machines Corporation, Hopewell Junction, N.Y.

[21] Appl. No.: 712,263

[22] Filed: Jun. 7, 1991

[51] Int. Cl.[5] .......... B41F 15/08; H01L 21/44

[52] U.S. Cl. .......... 101/114; 101/129; 101/127.1; 156/344; 156/584; 427/282; 437/187; 437/924; 437/948

[58] Field of Search .......... 101/114, 121, 124, 128.21, 101/129, 127.1; 427/282; 425/113, 110; 437/187, 924, 948, DIG. 100, DIG. 104, DIG. 105, DIG. 106; 156/344, 584

[56] References Cited

U.S. PATENT DOCUMENTS

| | | | |
|---|---|---|---|
| 3,214,971 | 11/1965 | Hammond | 73/150 |
| 3,384,931 | 5/1968 | Cochran et al. | 18/30 |
| 4,068,994 | 1/1978 | Cadwallader et al. | 425/110 |
| 4,084,506 | 4/1978 | Nakatani | 101/127 |
| 4,194,392 | 3/1980 | Lombard et al. | 73/150 A |
| 4,304,536 | 12/1981 | Davis et al. | 425/110 |
| 4,312,212 | 1/1982 | Clendenin | 73/15.4 |
| 4,362,486 | 12/1982 | Davis et al. | 425/110 |
| 4,397,078 | 8/1983 | Imahashi | 29/574 |
| 4,413,510 | 11/1983 | McCusker et al. | 73/150 A |
| 4,519,760 | 5/1985 | Norell | 425/113 |
| 4,605,354 | 8/1986 | Daly | 414/730 |
| 4,808,435 | 2/1989 | Cropp et al. | 427/97 |
| 4,893,513 | 1/1990 | Schroeder et al. | 73/827 |
| 4,902,371 | 2/1990 | Andria et al. | 156/344 |
| 5,052,291 | 10/1991 | Takahashi . | |

FOREIGN PATENT DOCUMENTS

| | | | |
|---|---|---|---|
| 145478 | 11/1979 | Japan | 437/948 |
| 44822 | 4/1980 | Japan | 101/129 |
| 71025 | 5/1980 | Japan | 437/948 |
| 1306729 | 4/1987 | U.S.S.R. | 101/129 |

OTHER PUBLICATIONS

"Thick-Film Circuit Printing"; Screen Printing Magazine, pp. 66-69; Albert Kosloff, Apr. 1983.

Dynamic Matching of Acceleration Transducers; Transactions of the ASME; vol. 108; pp. 306-313; Dec. 1986; Peleg et al.

Adaptive Control of Vehicle Suspension; Vehicle System Dynamics; 16 (1987); pp. 57-74; A. Hac.

*Primary Examiner*—Edgar S. Burr
*Assistant Examiner*—Eric P. Raciti
*Attorney, Agent, or Firm*—Whitham & Marhoefer

[57] ABSTRACT

An apparatus and method for screening a pattern of material onto a surface including detection of the instant of separation of the mask from the surface after screening. Particularly as applied to a process for making a multi-layer ceramic device with an automated apparatus, the screening process is speeded by initiating high speed movement immediately when the separation of the mask from the surface is complete. In a preferred embodiment, a shock absorber is used to limit the rate of change of motion of the mask and a sensor is placed directly on a portion of the shock absorber structure. Noise reduction is accomplished through differential sensing and thresholding to improve detection.

18 Claims, 4 Drawing Sheets

THICK FILM MASK SEPARATION DETECTION SYSTEM

BACKGROUND OF THE INVENTION

1. Field of the Invention

The present invention generally relates to apparatus and method for producing a pattern using a stencil or mask and, more particularly to an apparatus and method for separating the mask or stencil from a surface on which the pattern has been formed.

2. Description of the Prior Art

Forming patterns of a material on a surface by extruding the material through a mask has been applied in many fields such as printing and engraving, graphic arts and manufacturing processes, particularly in the electronics industry. The ability to form a plurality of conductors simultaneously on a surface permits an inexpensive alternative wiring technique which also results in a compact wiring structure.

The scale of integration in integrated circuits has steadily increased over the years, resulting in integrated circuits of extreme complexity and capable of very comprehensive functions. It is often desirable in such devices to use a plurality of different integrated circuit chips within such a device to afford design flexibility, improved yield and to allow the use of different semiconductor circuit technologies within the same device. A particularly successful type of construction of such devices has been developed, which uses a plurality of layers of ceramic, glass or other insulative materials of relatively high thermal conductivity with conductors formed on the respective surfaces and in through-holes or vias thereof. This type of construction is generally referred to as a multi-layer ceramic (MLC) structure. Since circuits constructed in this way are three-dimensional, a high degree of complexity is possible.

In such structures, the conductors are usually formed by a pattern of conductive paste. The conductive paste pattern is usually formed by extruding the paste, which is usually highly viscous, through a stencil or mask by passing an extrusion nozzle over the mask, located on the ceramic layer or "green sheet". The mask will typically be formed from a metal sheet having an apertured pattern. The mask structure may also have downward opening cavities supported periodically by mask stand-offs for forming large pattern areas. Such stand-offs are necessary to avoid flexing of the mask (e.g. being pushed away from the nozzle or being otherwise deformed) causing displacement of the conductive paste and shorts or voids in the conductive pattern. The term "stand-offs" will be used hereinafter to refer to a mask portion at a location where paste is not to be applied and where the mask rests directly on the surface on which the pattern is to be formed. It is also common in design rules for the fabrication of such masks to specify a characteristic distance for stand-off spacing, based on maximum uninterrupted feature size to be produced and the locations of stand-offs may be thought of as a regularly spaced array with the spacing corresponding to the characteristic distance.

After extrusion is complete, the mask must be separated from the green sheet without disturbing the paste pattern. Experience with manufacture of MLC devices has indicated that, at present, most defects are caused during separation of the mask from the green sheet. It should be noted that these steps are common to all screening processes for forming patterns on a surface and, while the invention will be disclosed in relation to a MLC manufacturing process in which pattern accuracy is very critical, applicability is not to be considered limited thereto.

As disclosed in U.S. Pat. No. 4,902,371, to Andris et al., assigned to the assignee of the present invention and hereby fully incorporated by reference herein, most pattern defects occur near the center of the mask. Since the mask and the green sheet are both supported at their edges, as the two parts are separated, both assume a slightly bowed shape. Near the edges, the mask apertures place a shear force on the viscous paste and the mask usually separates cleanly from the green sheet surface. However, near the center, the mask places tension on the paste and can pull portions of paste off the green sheet under certain circumstances, causing pattern voids.

More often, as the mask separates from the green sheet with a snapping action at the center of the mask, spikes of paste are formed at the edges of the paste pattern in the central area. Since the spacing of areas of the conductive paste pattern is often very fine, these spikes often cause shorts between conductors either by simply collapsing onto the green sheet or by having the excess paste therein spread out during further processing such as when the green sheets are laminated into the final MLC device.

Also, it is at this point in the screening process that greatest mechanical and acceleration forces are exerted on concentrated areas of the mask, causing deflection and distortion thereof, particularly in areas where mask features are very small. Such distortions will eventually cause metal fatigue and fracture of smaller features of the metal mask. Further, screened material adhering to the mask during this stage may cause defects in subsequently masked green sheets.

It should be noted that even if it is attempted to remove the mask by peeling it away from the surface from one end, the limitations on the flexure of the mask and the necessity that the mask not be shifted relative to the green sheet make the application of tension to the paste in some area unavoidable. Therefore, it is to be understood that the term "central area" refers to the area where the mask and surface finally separate and in which tension of the screened material is greatest, although the area may not be centrally located on the mask or surface and may, in fact, may be moved from the center by design or simply variation in the structures used to support and manipulate the mask and surface. However, for purposes of visualizing the circumstances of the invention in the environment of an MLC screening operation, the central area is about a 2.25" diameter generally circular area and corresponds to about 10% to 25% of the mask area. However, for purposes of counting defects in the following discussion, the central area is considered to be a 2.25"×2.25" square area.

As disclosed in the above-incorporated patent, much of the spiking in the central area of the patterned surface is due to the relatively uncontrolled snapping action of the mask and green sheet at the time of separation. In order to achieve control of mask motion, a shock absorber including a shock absorber pad was lowered onto the central area of the mask and a force applied thereto to balance the forces due to the adhesion to the surface. In this way, the central area of the mask could be removed from the surface in a smooth and controlled motion. However, the speed of separation of the mask from the surface remains critical to the reduction of spiking during this process.

In an effort to reduce the spiking of the conductive paste, mask separation speed has been varied and it has been found that a reduced separation speed reduces the defects which occur in the central area of the mask. However, this possibility carries a high cost in terms of the throughput of the system. For example, a ten second separation time has yielded defects in the central area and, to a lesser degree, throughout the patterned area even when a clean mask was used for each screening. A fifteen second separation time yielded only about half as many defects as the ten second separation time in both the central area and in other areas of the green sheet. If a second screening was attempted without cleaning the mask between screenings, defects in the central area and peripheral area of the mask were approximately tripled. To increase throughput, multiple screenings for each cleaning of the mask is very desirable but virtually precluded at ten and fifteen second separation speeds by the increased incidence of defects.

Although no defects were noted outside the central area when a thirty second separation time was used even using the mask for a second screening process before cleaning, the number of central area defects, while lowered, still remained significant and comparable to a ten second separation time after screening with a clean mask.

In order to increase throughput of the system, alteration of speed of separation by reducing separation speed when the central area was reached has been attempted. However, without actual monitoring of the separation process, the point at which speed should be reduced could only be estimated. It was found that the geometry of the mechanical system during separation would change significantly with very slight changes in paste viscosity and, more importantly, randomly from green sheet to green sheet due to slight changes in the amount of elastic deformation of the green sheet which occurred in response to the separation force applied to it through the paste.

For the same reason, attempts to control speed changes of the process through a feedback system have not been successful because of this variability of the geometry of the parts during the process. In essence, it was not possible to accurately sense the separation because of variability of the location of the mask and surface at a particular point in the separation process. Additionally, it was very difficult to provide space at an appropriate location, particularly below the mask, to even attempt such automatic control without causing interference with the process. It should be noted that even if appropriate space could be provided at such a location, any sensor and optical sensors, in particular, would be subject to contamination from the screened material which would degrade reliability and system performance. Further, such speed alteration would cause a 2% to 5% reduction in production capacity while there would be no assurance that the process would be performed optimally.

It should also be noted that in using the apparatus disclosed in the above incorporated patent, a shock absorber is brought into contact with the mask during separation. During the separation period, the relative motion of parts is very slow to reduce defects as noted above. After separation is complete, the parts can be moved at high speed to a home position to allow another screening operation to be performed. However, the variability of the separation operation, regardless of the speed at which it is done, prevents the high speed movement to the home position from being initiated immediately after separation is complete. For the same reasons pointed out above with regard to the difficulty of monitoring the stages of the separation process, extra time must be provided prior to initiating high speed movement to ensure that the mask and surface have, in fact separated. During this additional time, the shock absorber remains in contact with the mask and the mask and surface move apart slowly. Since the mask may be damaged and pattern defects are virtually assured if high speed movement is initiated before separation is complete, the amount of additional time is usually on the order of 3–5 seconds to cover virtually all of the statistical variation in actual separation times. This amount of time corresponds to a substantial expense in a production environment and represents about a 10% reduction in throughput of the screening operation compared to the throughput otherwise possible.

SUMMARY OF THE INVENTION

It is therefore an object of the present invention to provide an arrangement for sensing actual separation of a screening stencil or mask from a surface at the instant of separation of the mask from the surface.

It is another object of the invention to provide an arrangement for initiating a high speed operation of screening equipment at the instant of separation of a screening mask from a surface.

It is a further object of the invention to provide an apparatus and method of monitoring the separation state of a screening mask and a surface which is independent of the location at which that separation occurs and independent of variations in geometry of the mask and/or the surface.

In order to satisfy the above and other objects of the invention, a screening apparatus is provided including means for separating a mask from a surface subsequent to screening a material through said mask, including a detector arrangement for detecting separation of the mask from the surface including a sensor for sensing a rate of change of a physical quantity.

In accordance with another aspect of the invention, a method of producing a pattern of material on a surface by screening said material through a mask is provided including the step of detecting a rate of change of separation of the mask from the surface.

In accordance with a further aspect of the invention a product is provided having a pattern of material applied to a surface by screening the material through a mask which is produced by a method including the step of detecting a rate of change of separation of the mask from the surface.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
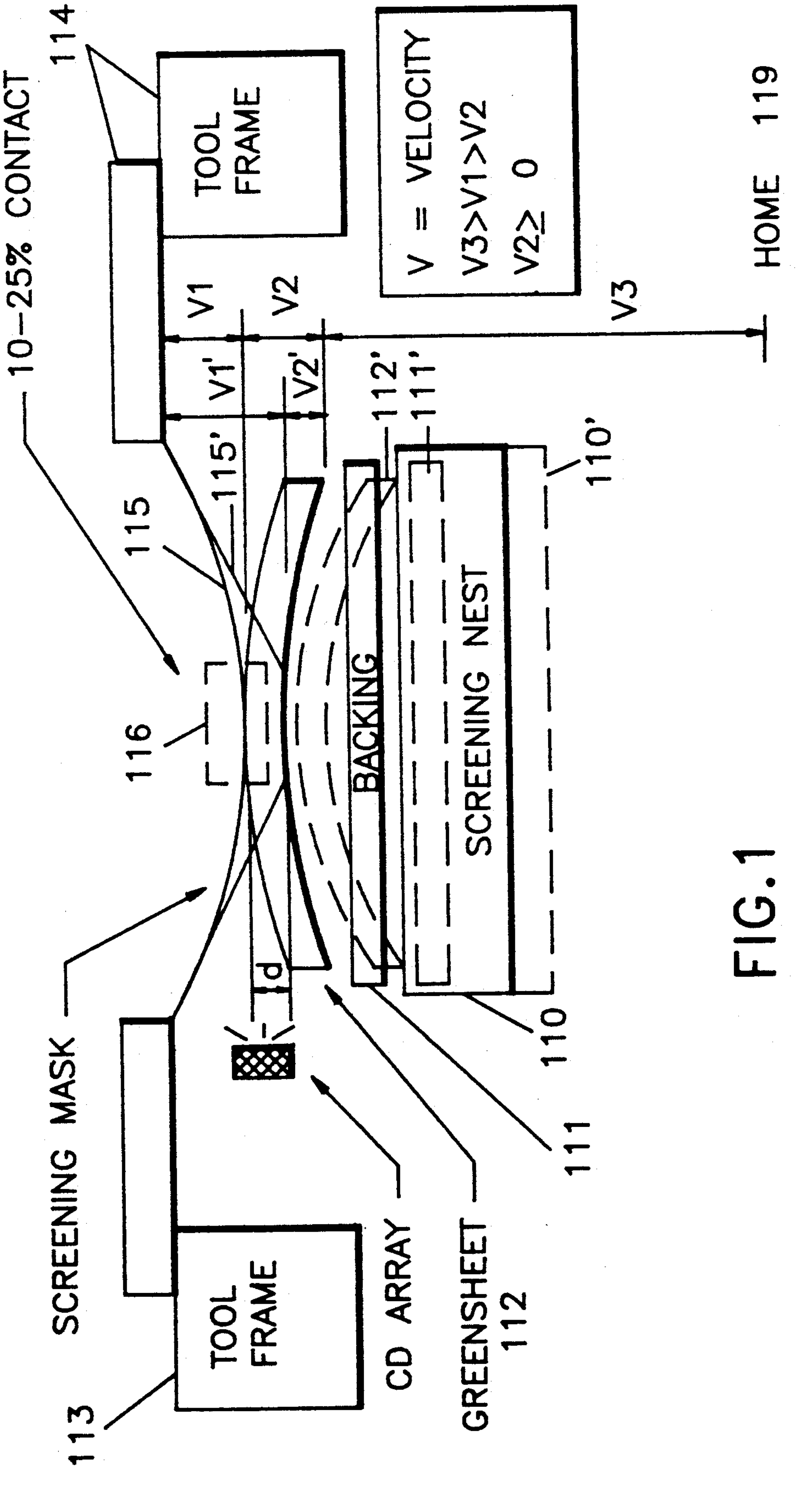
FIG. 1 is a schematic diagram illustrating the separation of a mask from a green sheet surface after screening.

Referring now to the drawings, and more particularly to FIG. 1, the basic screening arrangement is shown during separation at the point that only the central portion of the mask is in contact with the green sheet. Previous to this point being reached, the screening nest 110 backing 111 and green sheet 112 is raised into contact with mask 115, supported horizontally by stationary tool frame 114. Of course, relative motion could be provided in any direction by any combination of motions of either of the tool frame and the screening nest. However, at the present time, a stationary tool frame is preferred to simplify use with a shock absorber in accordance with the above-incorporated patent. Proper movement of the screening nozzle is also more easily achieved if this is done.

After screening is done by extruding the screened material through the mask with a nozzle, the screening nest is preferably lowered away from the mask. The mask, being supported at the edges, is separated from the green sheet, which is also generally supported at the edges by one or more retainers (not shown). The adhesion of the mask and the green sheet causes an upward force to be applied to the green sheet, causing it to bow upwards, as shown to an exaggerated degree. This bowing will increase during the course of separation as the point of separation approaches the central area.

It should be appreciated that the amount of bowing will depend on the elasticity of the green sheet. Similarly, the shape of the mask at the point during separation shown will depend on the tension applied thereto, the adhesion due to the viscosity of the paste and other factors. For instance the geometry of the mechanical system could also be similar to that depicted by the elements 110′, 111′, 112′ (depicted with slightly differing thickness and, therefore, elasticity), and 115′ illustrated by dashed lines. Thus, it can be seen that the vertical location of the point of separation will be subject to substantial variation, indicated by dimension d. Therefore, the location of a sensor or an array of sensors to monitor separation must cover a substantial variation in geometry and sensing is difficult.

For instance, if it is desired to alter speed during different ranges of movement as described above such that the velocity over the distances indicated followed the relation V3>V1>V2, where V2 is greater than or equal to zero, the separation monitoring structure must be able to accommodate and control separation speed for the ranges of motion indicated by V1′ and V2′, as well as all points between. It should also be noted that the greatest speed change is at the point between V2 and V3 and, to avoid mask damage as indicated above, the upper limit of the V3 range will often be lowered to assure that separation is complete before high speed motion is initiated to return the various elements to home locations, such as at 119 for the screening nest. This reduction of the V3 range extends the low speed V2 range and slows the entire operation.

Figure 2:
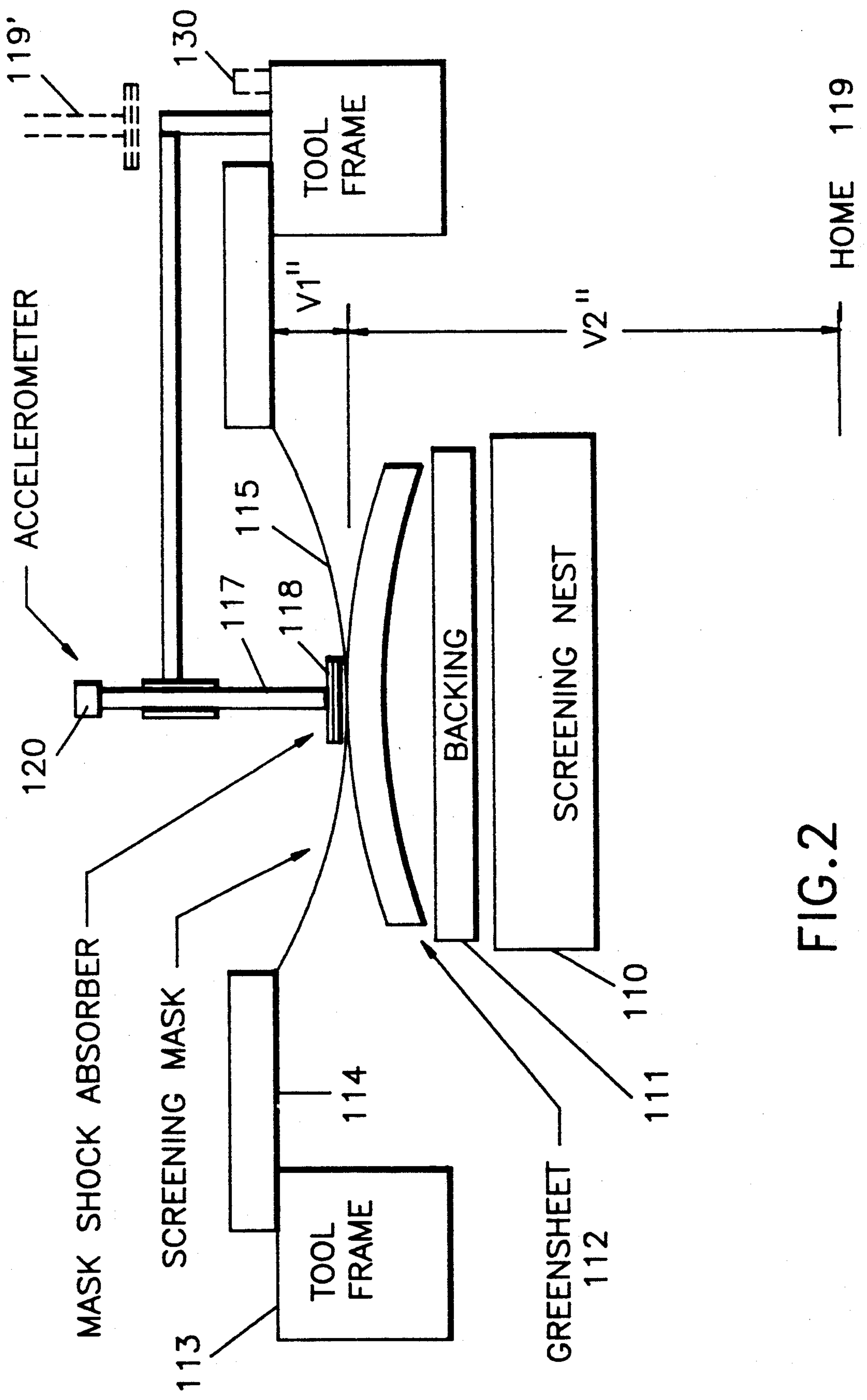
FIG. 2 is a schematic diagram showing the inclusion of the invention in the apparatus and process depicted in FIG. 1, FIGS. 2A and 2B are diagrams of shock absorber pads usable with the present invention.
Figure 2A:
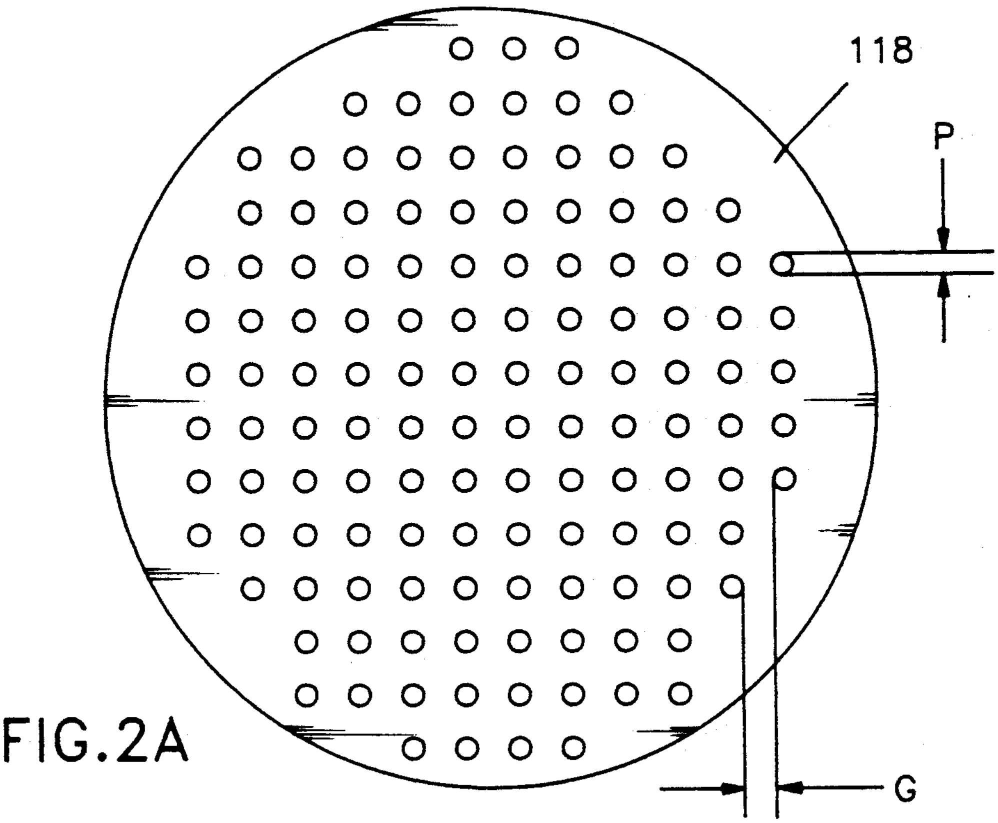
Figure 2B:
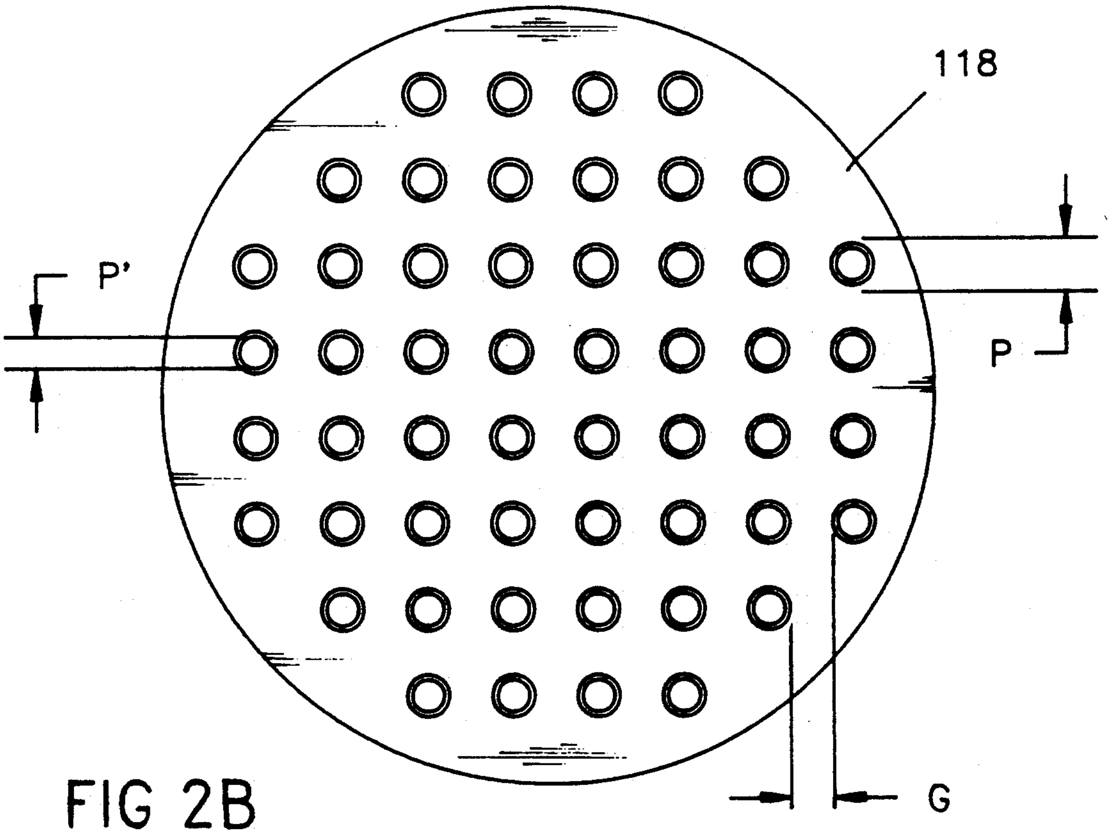

In contrast, referring to FIG. 2, the invention provides for the use of a sensor 120 such as a vibration sensor or an accelerometer which is preferably connected (e.g. attached) to the shock absorber 117 including shock absorber pad 118. Pad 118 is preferably of the form disclosed and claimed in concurrently filed application Ser. No. 07/712,259, by Gerald S. Andris and John Gauci, entitled MASK SHOCK ABSORBER PAD, assigned to the assignee of the present invention and hereby fully incorporated by reference. Specifically, as shown in FIGS. 2A and 2B that application discloses and claims a particular geometry for protuberant features on the shock absorber pad 118 including hollow features having a concavity oriented toward the mask or perforated sheet. The minimum separation of features, G, is a function of the viscosity of the screened medium and the pad feature size, P, is a function of the mask stand-off characteristic spacing or mask feature size. The transverse dimension of the concavity, P′, is generally slightly smaller than the pad feature size but not significantly less than the minimum feature separation distance. Generally, the pad feature size will be at least 10% greater than the mask stand-off spacing or maximum uninterrupted mask feature size. The separation distance, G, bears a generally linear relationship to the viscosity of the screened medium, V, which has optimally been found to be $$G=0.00045\ V\pm 0.005, \pm 10\%$$

where G is expressed in inches and V is expressed in Pascals per second. A methodology for design of the shock absorber pad by sequentially determining G, P and P′, if applicable, is also disclosed therein as is a method of screening including the step of adjusting the viscosity of the screened medium based on shock absorber pad feature spacing, in order to satisfy the above relationship.

The sensor 120, so located, will then be able to detect the release of adhesion between the mask and the green sheet which would result in a snapping action of the mask if the shock absorber were not used. In this way, the exact instant of separation can be detected in a manner completely independent of the geometry of the mask and green sheet (e.g. independently of variation of V1″) and the high speed motion over the remaining range of V2″ may be initiated with a minimum, if any, time or distance allowance margin for the prevention of mask damage as speed is changed. Therefore, the high speed motion to return the screening nest and the shock absorber to home positions 119 and 119′ can be initiated at the earliest possible time, resulting in an overall saving of the time of the operation of at least the 3 to 5 second margin noted above.

It should also be noted that the preferred attachment location of the sensor 120 to the shock absorber does not require space below the tool frame 114 which is difficult to provide. On the contrary, there is little, if any, restriction on space for the sensor when located on virtually any portion of the mechanism for operating the shock absorber. In fact, the only restriction on the form, type or location of the sensor would be the weight thereof and counterbalancing thereof should be supplied if the sensor weight exceeded that necessary to match the shock absorber contact force with the adhesion forces of the mask and the green sheet, as described above. While the type of sensor is preferably of the vibration sensor or accelerometer type, virtually any type of sensor capable of detecting a rate of change of a physical quantity could be used, including optical motion sensors. This is due to the essential characteristics of the separation process described above where the rate of change of separation tends to become rapid at the time of separation of the central area of the mask. Even when the motion is made smooth by use of a shock absorber, there will be a rapid change of the forces distributed through the mechanical which will cause minute deflection which propagates through the mechanical structures of the apparatus.

Since the separation time margin before high speed motion of the screening nest is begun, the time consumed by the separation process is greatly reduced and throughput of the apparatus is increased. Some or all of this time saving can be advantageously used to provide an overall decrease in separation speed over range V1" resulting in improved pattern quality with no throughput penalty. It should be noted that a dimension corresponding to V2 of FIG. 1 is not shown in FIG. 2 for the simple reason that the accurate detection of completion of separation for initiation of high speed movement of the apparatus provides a far greater increase in throughput than carrying out the separation in plural phases. A change in speed could, of course, be provided but is not necessary to the practice of the invention. In fact, by use of the invention, a slower separation speed can be used during the entirety of the mask separation while still increasing throughput. Since the lower separation speed can be used, time is also saved by the avoidance of mask cleaning after each screening and high pattern quality can be maintained for two and possibly more screening operations per mask cleaning.

Figure 3:
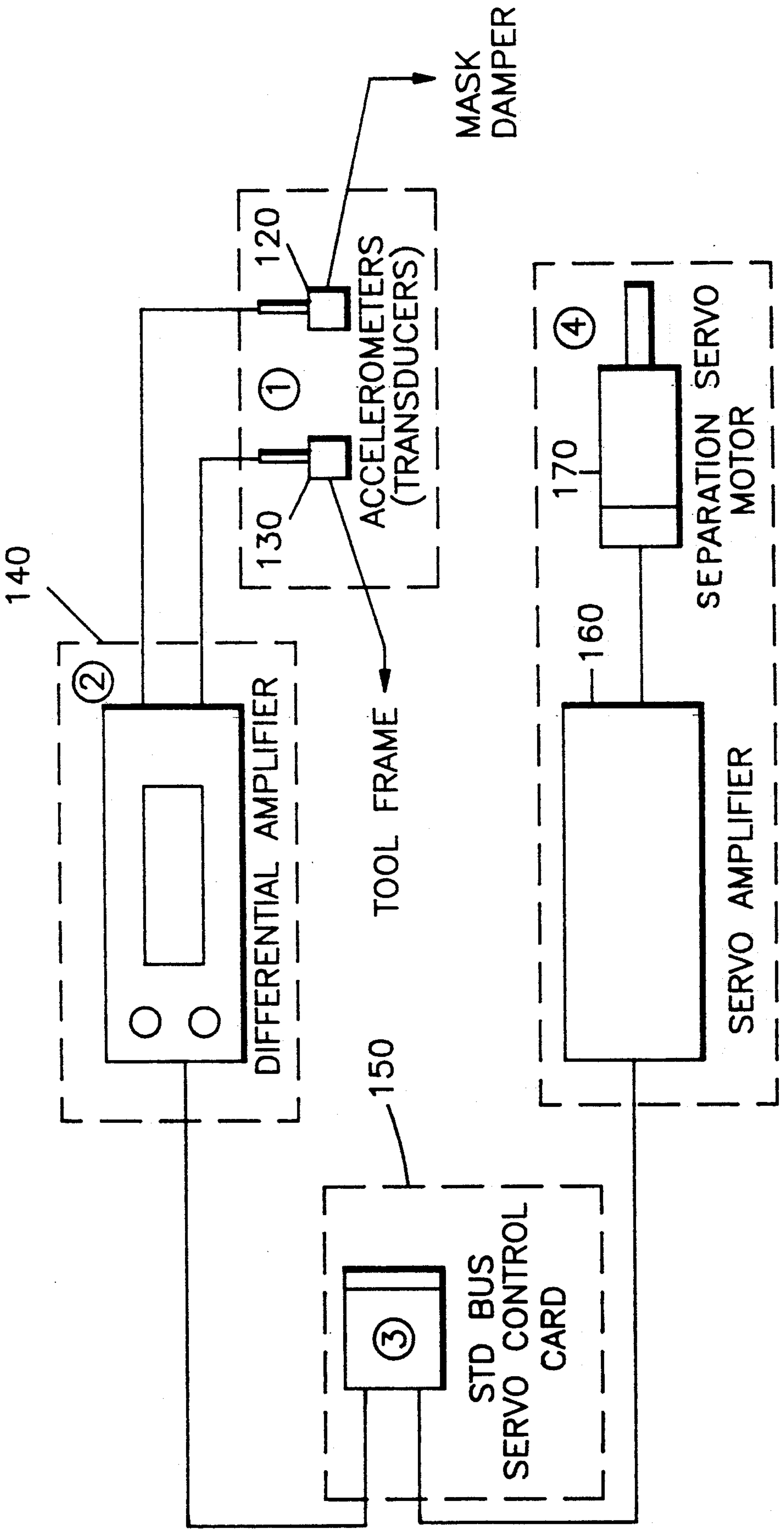
FIG. 3 is a schematic diagram of the mask separation system in accordance with the present invention.

Referring now to FIG. 3, a preferred implementation of the invention will now be explained. Since the screening apparatus is fairly complex, it is considered that the accuracy and reliability of detection of sensor 120 can be best supported by providing a differential sensor arrangement. For this purpose, a second sensor 130, similar to sensor 120 is employed and attached to another portion of the machine such as shown by dotted lines at 130 of FIG. 2. The criteria for choice of location is simply that sensor 130 should be subject to all vibrations of the screening apparatus except those propagating from the shock absorber pad 118. To this end, location on the stationary tool frame is preferred. Should any of the vibration arising from mask separation be propagated through the mask to the tool frame, it would be in an opposite sense from that detected by sensor 120 and probably of substantially differing phase which may enhance detection beyond common mode noise rejection of the differential sensor arrangement.

As shown in FIG. 3, the outputs of sensors 120 and 130 are applied to a differential amplifier. This differential amplifier also preferably has the capability of thresholding the result of the signal comparison to further enhance detection. Alternatively, a signature of the vibration could be empirically determined for one or both sensors or the output of the differential amplifier in order to enhance the reliability of detection. In any case, it is important to the repeatability of operation that the magnitude and other parameters of the vibration resulting from separation be consistent. For that reason, it is preferred that shock absorber pads in conformance with the above incorporated, concurrently filed application be used since such pads are particularly designed to resist accumulation of screened material which might alter the mass and/or overall resilience characteristic of the pad. The differential amplifier/detector 140 output, in the form of an interrupt, is fed to a bus servo control card of any known type which controls the high-speed, post-separation movement of the screening nest and shock absorber which is carried out by servo amplifier 160 and servo motor 170.

In view of the above, it is seen that the invention provides a means of reducing or eliminating the need for operational allowances or margins during the separation of masks from surfaces subsequent to a screening operation by accurate and reliable detection of the instant of mask separation. This detection allows early initiation of high speed operations, resulting in a reduction in required time for the mask separation operation and a potential increase in quality of the screened pattern. This reduction in the time required for mask separation increases throughput of the screening apparatus and overall efficiency of the manufacturing process in which it is employed.

While the invention has been described in terms of a single preferred embodiment, those skilled in the art will recognize that the invention can be practiced with modification within the spirit and scope of the appended claims. For instance, the invention could be used by applying only a single sensor and/or could be practiced without the use of a shock absorber structure by placing sensor 120 on or in close proximity to the mask or the green sheet backing to sense the snapping action thereof. In such a case, the throughput of the screening apparatus would still be improved by early initiation of the high speed operation of the screening apparatus although the virtual elimination of spiking would not be fully realized.

Having thus described my invention, what I claim as new and desire to secure by Letters Patent is as follows:

1. A screening apparatus including a mask, means for screening a material through said mask onto a surface to form a pattern of said material on said surface, said mask being located adjacent said surface during si screening of said material and means for separating said mask from said surface subsequent to said screening of said material through said mask, said screening apparatus including detector means for detecting separation of said mask from said surface, said detector means including sensor means for sensing a rate of change of a physical quantity at a location which is subject to variation, and means for controlling the velocity of at least one part of said screening apparatus mean in response to said detector means.

2. A screening apparatus as recited in claim 1 wherein said sensor means is a vibration detector.

3. A screening apparatus as recited in claim 1 wherein said sensor means is an accelerometer.

4. A screening apparatus as recited in claim 1, further including a shock absorber means for limiting rapid motion of said mask when said mask fully separates from said surface.

5. A screening apparatus as recited in claim 4 wherein said sensor means is a vibration detector.

6. A screening apparatus as recited in claim 4 wherein said sensor means is an accelerometer.

7. A screening apparatus as recited in claim 4 wherein said sensor means is connected to said shock absorber means.

8. A screening apparatus as recited in claim 7 wherein said sensor means is a vibration detector.

9. A screening apparatus as recited in claim 7 wherein said sensor means is an accelerometer.

10. A screening apparatus as recited in claim 1, further including means for returning a portion of said screening apparatus to a home position in response to an output of said sensor means.

11. A screening apparatus as recited in claim 1, wherein said sensor means includes at least two sensors and said detector means includes a differential detector responsive to the outputs of said at least two sensors.

12. A screening apparatus as recited in claim 1 wherein said detector means includes means responsive to at least an output of said sensor reaching a predetermined threshold level.

13. A screening apparatus as recited in claim 11 wherein said detector means is responsive to at least an output of said differential detector reaching a threshold level.

14. A screening apparatus as recited in claim 4, wherein said shock absorber means includes a pad having a plurality of protuberant features thereon wherein a minimum separation between each of said protuberant features exceeds a distance having a predetermined relationship to a nominal viscosity of said viscous material.

15. An apparatus as recited in claim 14, wherein a transverse dimension of at lest one said protuberant feature is greater than a characteristic distance.

16. An apparatus as recited in claim 15, wherein said protuberant features are hollow, having a concavity oriented toward said mask for contact therewith, a maximum transverse dimension across said concavity being approximately equal to or greater than said minimum separation distance.

17. A method of producing a pattern of material on a surface by screening said material through a mask including the steps of detecting a rate of change of separation of said mask from said surface, and controlling velocity of a part of an apparatus performing at lest a portion of said method of producing a pattern on a surface in response to said detecting step.

18. A method as recited in claim 17, including the further step of adjusting viscosity of said viscous material in accordance with a predetermined spacing of features of a shock absorber pad.

* * * * *